US009864011B2

(12) United States Patent
Larsson et al.

(10) Patent No.: US 9,864,011 B2
(45) Date of Patent: Jan. 9, 2018

(54) METHOD FOR PERFORMING A DIAGNOSTIC TEST OF AN ALTERNATOR IN A VEHICLE, TEST ARRANGEMENT AND VEHICLE

(71) Applicant: VOLVO CAR CORPORATION, Gothenburg (SE)

(72) Inventors: Torbjorn Larsson, Gothenburg (SE); Emil Wall, Gothenburg (SE); Mats Thorngren, Gothenburg (SE); Pelle Thorson, Ucklum (SE); Aryan Madadi, Gothenburg (SE)

(73) Assignee: Volvo Car Corporation, Gothenburg (SE)

( * ) Notice: Subject to any disclaimer, the term of this patent is extended or adjusted under 35 U.S.C. 154(b) by 256 days.

(21) Appl. No.: 14/578,547

(22) Filed: Dec. 22, 2014

(65) Prior Publication Data
US 2015/0198669 A1 Jul. 16, 2015

(30) Foreign Application Priority Data
Jan. 10, 2014 (EP) ..................... 14150768

(51) Int. Cl.
*G01R 31/34* (2006.01)
*G01R 31/00* (2006.01)
(Continued)

(52) U.S. Cl.
CPC ......... *G01R 31/343* (2013.01); *G01R 31/007* (2013.01); *H02J 7/1461* (2013.01); *F02N 11/04* (2013.01); *F02N 11/108* (2013.01); *F02N 2200/062* (2013.01); *F02N 2200/063* (2013.01); *F02N 2200/064* (2013.01); *G01R 31/3627* (2013.01)

(58) Field of Classification Search
CPC .............. G01R 31/007; G01R 31/3627; G01R 31/343; G01R 31/3648; G01R 31/3693; G01R 31/34; G01R 31/006; G01R 31/3631; G01R 31/3662; G01R 31/36; G01R 31/3606; G01R 31/3624; G01R 31/3641; G01R 3/3651; G01R 31/3668; G01R 31/3434; F02N 11/04; F02N 11/10; F02N 11/108; F02N 2200/063; F02N 2200/062; F02N 2200/064
See application file for complete search history.

(56) References Cited

U.S. PATENT DOCUMENTS 5,151,647 A * 9/1992 Frantz ..................... H02J 7/166
322/11
6,150,793 A * 11/2000 Lesesky .................. F02N 11/08
320/103
(Continued)

FOREIGN PATENT DOCUMENTS

EP 0591871 4/1994

OTHER PUBLICATIONS

Extended European Search Report for EP 14150768.1, Completed by the European Patent Office, dated Jun. 23, 2014, 7 Pages.

*Primary Examiner* — Tung X Nguyen
*Assistant Examiner* — Lee Rodak
(74) *Attorney, Agent, or Firm* — Brooks Kushman P.C.

(57) ABSTRACT

A method for performing a diagnostic test of an alternator, a test arrangement and a vehicle are provided. The method may include running an engine, providing a signal representative of a pre-determined environmental condition to the alternator, providing an output voltage and output current to a battery based on the pre-determined environmental condition, and determining a battery voltage. The method may also include comparing the determined battery voltage with a pre-defined reference-voltage representative of the pre-determined environmental condition and outputting an approved test result if the difference between the determined battery voltage and the pre-defined reference voltage falls within a predetermined range.

13 Claims, 3 Drawing Sheets

(51) Int. Cl.
*H02J 7/14* (2006.01)
*F02N 11/10* (2006.01)
*G01R 31/36* (2006.01)
*F02N 11/04* (2006.01)

(56) References Cited

U.S. PATENT DOCUMENTS

| | | | |
|---|---|---|---|
| 6,194,877 B1* | 2/2001 | Judge | H02J 7/1461 |
| | | | 320/162 |
| 6,242,921 B1* | 6/2001 | Thibedeau | G01R 31/343 |
| | | | 320/135 |
| 6,466,025 B1 | 10/2002 | Klang | |
| 2001/0054890 A1* | 12/2001 | Thibedeau | G01R 31/343 |
| | | | 324/76.41 |
| 2004/0049361 A1* | 3/2004 | Hamdan | G01R 31/007 |
| | | | 702/115 |
| 2005/0035752 A1* | 2/2005 | Bertness | G01R 31/007 |
| | | | 324/120 |
| 2006/0119365 A1 | 6/2006 | Makhija | |
| 2006/0244456 A1 | 11/2006 | Henningson et al. | |
| 2007/0241723 A1* | 10/2007 | Billat | H02J 7/1446 |
| | | | 322/28 |
| 2008/0224710 A1* | 9/2008 | Henningson | G01R 19/16542 |
| | | | 324/433 |
| 2009/0024266 A1* | 1/2009 | Bertness | B60L 3/0046 |
| | | | 701/22 |

\* cited by examiner

METHOD FOR PERFORMING A DIAGNOSTIC TEST OF AN ALTERNATOR IN A VEHICLE, TEST ARRANGEMENT AND VEHICLE

CROSS-REFERENCE TO RELATED APPLICATIONS

This application claims foreign priority benefits under 35 U.S.C. §119(a)-(d) to European patent application number EP 14150768.1, filed on Jan. 10, 2014, which is incorporated herein by reference in its entirety.

TECHNICAL FIELD

Embodiments herein relate to a method for performing a diagnostic test of an alternator of a vehicle. Embodiments herein further relate to a test arrangement for performing a diagnostic test of an alternator of a vehicle and a vehicle comprising such a test arrangement.

BACKGROUND

Vehicles equipped with an internal combustion engine normally comprise an alternator and a battery. When running, the internal combustion engine drives the alternator and the alternator is arranged to charge the battery. The battery may be used to provide electricity to a number of electrical consumers, such as spark plugs, headlights, climate control systems, entertainment systems and external chargers.

In case of a failure in a component of the alternator-battery-chain, the electrical consumer may not receive enough electricity to function properly. For example, the alternator may fail to charge the battery, the battery may not be able to store the electricity in one or more cells of the battery for a sufficient amount of time, and/or a connection between the components may fail. In order to troubleshoot the cause of the failure, all or some of the different components normally must be tested, e.g. in a workshop.

US2006119365A1 describes a method and apparatus for testing a charge system of a vehicle. A test module is connected to a remote device, such as a battery tester, a scan tool, a personal computer or a personal digital assistant. The remote device is connected to a power source, which power source additionally provides power to the test module via the remote device. An alternator and/or a starter motor assembly is connected to the test module. The test module is capable of controlling a field current of the alternator and performing voltage and current measurements at prescribed test points in the vehicle starting and charging system.

In some situations test equipment, such as handheld workshop test equipment, incorrectly indicates that the alternator is broken, or fails to supply a sufficient amount of electricity to the battery. This could be caused e.g. by inaccuracy of voltage measurements, electrical loads in the vehicle electrical system which are affecting the test result and/or human factors, such as a workshop operator not following correct instructions.

If test equipment incorrectly indicates an alternator failure, the alternator may be unnecessarily replaced in a workshop. This will lead to high costs for both customers and warranty providers.

Clearly, there remains a need for eliminating or reducing the number of unnecessary alternator replacements.

SUMMARY

Embodiments herein aim to provide a method for performing a diagnostic test of an alternator of a vehicle, eliminating or at least reducing the problems and/or drawbacks described above.

According to an embodiment, this is provided by a method for performing a diagnostic test of an alternator of a vehicle comprising an internal combustion engine arranged to drive the alternator and the driven alternator being arranged to charge a battery via an electrical connection thereto, wherein the method comprises; running the internal combustion engine at idle speed, providing, by a control unit, a signal representative of a pre-determined environmental condition to the alternator, providing, by the alternator, an output voltage and output current to the battery based on the pre-determined environmental condition, determining, by a sensor connected to the battery, at least one of the following: complete battery voltage, voltage of respective battery cells and current load, and providing the determined battery voltage and current load to the control unit, comparing, by the control unit, the determined battery voltage with a pre-defined reference-voltage representative of the pre-determined environmental condition and outputting, by the control unit, an approved test result if the difference between the determined battery voltage and the pre-defined reference voltage falls within a predetermined range.

Since an approved test result is output if the difference between the determined battery voltage and the pre-defined reference voltage falls within a predetermined range, a capacity for the alternator in the selected pre-determined environmental condition is determined. A user, such as a mechanic at a workshop, who carries out the method for performing the diagnostic test of the alternator, is hereby informed of whether the alternator is functioning as expected in a selected pre-determined environmental condition.

Since the control unit provides the input signal representative of a pre-determined environmental condition to the alternator, the method may be performed without any external handheld test equipment connected to the alternator. Thanks to the method, the vehicle alternator may be tested in a very reliable and economically efficient manner. In addition, a risk of errors relating to human factors, such as incorrect use of external handheld test equipment, which may lead to unnecessary replacement and/or repairing of the alternator or other vehicle parts is eliminated or at least reduced.

Thus, hereby is provided a method for performing a diagnostic test of an alternator of a vehicle, eliminating or at least reducing the problems and/or drawbacks described above.

According to some embodiments the abovementioned method-steps are performed for a plurality of different pre-determined environmental conditions. The method may further comprise; outputting, by the control unit, an approved total test result only if an approved test result is achieved for each of the plurality of different pre-determined environmental conditions.

Since the steps are performed for a plurality of different pre-determined environmental conditions and an approved total test result is output only if an approved test result is achieved for each of the plurality of different pre-determined environmental conditions, the alternator is allowed to be tested in a simple, reliable and cost-efficient manner for a number of different pre-defined environmental conditions.

Hereby the operability of the alternator may be tested and evaluated for an entire range of pre-defined environmental conditions, such that a total operability of the alternator over the range may be tested.

According to some embodiments the method further comprises; selecting the pre-determined environmental condition to represent at least one of a pre-determined temperature and a pre-determined temperature-range.

Since the one or more pre-determined environmental condition may represent at least one of a pre-determined temperature and a pre-determined temperature-range, the alternator operability in different temperatures may be tested.

A pre-determined environmental condition may be seen as a "virtual value", which replaces a temperature of the battery. The battery may be charged using different voltages for different temperatures. Charging may e.g. be improved if a cold battery is charged with a higher voltage than a warm battery.

For example, the control unit may first provide the alternator with a signal representative of a pre-determined temperature of e.g. +60 degrees Celsius. The method-steps of determining, comparing and outputting a test result is performed. An approved test result for the pre-determined environmental condition of +60 degrees Celsius is output only if the difference between the determined battery voltage and the pre-defined reference voltage for +60 degrees Celsius is within a predetermined range. The pre-determined range may for example be less than one or two volts (V). According to some embodiments an approved test result is output only if the difference between the determined battery voltage and the pre-defined reference voltage is less than 0.5V. According to some embodiments the range is e.g. +/−0.4V, +/−0.3V or +/−0.2V. A smaller range implies higher demands on the alternator.

When the method steps has been performed for the pre-determined temperature of e.g. +60 degrees Celsius, the control unit provides a second signal representative of a second pre-determined temperature of e.g. +50 degrees Celsius to the alternator. The method-steps of determining, comparing and outputting a test result is performed. An approved test result for the pre-determined environmental condition of +50 degrees Celsius is output only if the difference between the determined battery voltage and the pre-defined reference voltage for +50 degrees Celsius is within a predetermined range.

The control unit may continue to provide signals representative of a number of pre-determined temperatures to the alternator. According to some embodiments, the signals are representative of +60, +50, +40, +30, +20, +10 and 0 degrees Celsius. These seven pre-determined temperatures may be suitable in some applications. In some embodiments fewer temperatures, such as four, five or six different temperatures are selected. In some embodiments a larger number, such as eight, nine or ten different temperatures are selected. Any temperatures, and number of different temperatures, may be selected, and may depend on vehicle model, market etc.

When an approved test result has been output for all pre-determined temperatures, an approved total test result may be output. The alternator is then considered to function properly and does not need to be repaired or replaced.

According to some embodiments the method comprises; running the internal combustion engine on idle speed for a pre-determined amount of time before providing the signal representative of a pre-determined environmental condition to the alternator. Since the internal combustion engine is kept idling a pre-determined amount of time before the signal is sent from the control unit to the alternator, any specific control unit/alternator settings which may be active a short time after start of the internal combustion engine may be ended. Hereby the method can be performed when the control unit/alternator is in a normal charge-mode.

According to some embodiments the method comprises; minimizing electrical loads and current consumers before providing the signal representative of a pre-determined environmental condition to the alternator. Since electrical loads are set to a minimum, and any current consumers, such as defrosters, seat heating and external chargers are turned off, a more accurate test result may be achieved when the method is performed. In addition, a risk of a fully loaded and thereby saturated alternator is reduced. Hereby a probability that the alternator can keep a correct output voltage is highly increased.

According to some embodiments the method comprises; controlling the battery charge level to exceed a first pre-defined level. Since the battery charge level is controlled to exceed a first predefined level, it may be ensured that the battery will accept charging current regardless of battery temperature. Generally, a cold battery has a lower charge acceptance than a warm battery. In addition, a more accurate test result may be achieved when the method is performed. The first predefined level may e.g. be set to at least 40-60% charge level.

According to some embodiments the method comprises; checking if the battery current exceeds a predefined value, and according to some embodiments the method comprises; checking if the alternator load exceeds a predefined value.

If the battery current exceeds a predefined value, for example 50 Ampere (A), and the alternator load exceeds a predefined value, such as 50 Watt (W), the battery may be considered to be too discharged for starting or continuing the method. Since it is checked if the battery current exceeds a predefined value, a user may charge the battery if necessary.

If the battery current is less than a predefined value, for example 50 A, but higher than another predefined value, for example 0 A, and the alternator load is less than a predefined value, such as 50 W, the alternator may be loaded to a high extent. It may then be necessary to check if the electrical loads are correctly adjusted. It may also be necessary to let a cooling fan decrease a temperature of the engine. The method for performing a diagnostic test of the alternator may then be started or continued.

If the battery current is less than a predefined level, for example 0 A and the alternator load exceeds a predefined value, such as 50 W, the method may need to be temporarily aborted. It may be necessary to check if the battery and the alternator are properly connected.

If the battery current is less than a predefined level, such as near 0 A and the alternator load is less than a predefined value, such as 50 W, the alternator produces no electricity or an insufficient amount of electricity. Electricity may then be drawn from the battery. This may be caused by a defect alternator, or due to a defect connection between the alternator and a charge regulator.

According to some embodiments the method comprises; throttling the combustion engine such that it exceeds a predetermined rpm for a predetermined amount of time. Since the internal combustion engine is throttled up it can produce more current and the alternator is allowed to self-magnetize. By increasing the number of revolutions per minute (rpm) during the testing, it may be excluded that a lack of output current from the alternator is a result of an insufficient rpm. An additional advantage is that if the alternator has not received a correct start-up-signal, the alternator will automatically start and produce current above a predetermined rpm. The alternator will thus enter a default back-up charging state. By throttling the engine, workshop mechanics can check whether the alternator is charging but the communication between different parts of the electrical system is defect, such as the communication between an alternator master node and an alternator regulator. This may be indicated if the alternator is charging the battery but not responds to the control signals from the alternator master node.

Thus, hereby is provided a method for performing a diagnostic test of an alternator of a vehicle eliminating or at least reducing the problems and/or drawbacks described above.

Embodiments herein also aim to provide a test arrangement for performing a diagnostic test of an alternator without the problems or drawbacks described above.

According to an embodiment, this is provided by a test arrangement for performing a diagnostic test of an alternator of a vehicle comprising an internal combustion engine arranged to drive the alternator and the driven alternator being arranged to charge a battery via an electrical connection thereto, wherein the battery is connected to a battery sensor for determining at least one of battery voltage, voltage of respective battery cells and current load. A control unit is arranged to provide a signal representative of a pre-determined environmental condition to the alternator. The alternator, when driven by the idling internal combustion engine, is arranged to provide an output voltage and output current to the battery based on the pre-determined environmental condition. The sensor is arranged to determine at least one of battery voltage, voltage of respective battery cells, current load and to provide the determined battery voltage and current load to the control unit. The control unit is arranged to compare the determined battery voltage with a pre-defined reference-voltage representative of the pre-determined environmental condition and to output an approved test result if the difference between the determined battery voltage and the pre-defined reference voltage falls within a predetermined range.

Since the test arrangement is arranged to output an approved test result if the difference between the determined battery voltage and the pre-defined reference voltage falls within a predetermined range, a capacity for the alternator in the selected pre-determined environmental condition is determined.

Thus, hereby is provided a test arrangement for performing a diagnostic test of an alternator of a vehicle eliminating or at least reducing the problems and/or drawbacks described above.

Embodiments herein also aim to provide a vehicle for performing a diagnostic test of an alternator without the problems or drawbacks described above.

According to an embodiment, this is provided by a vehicle, wherein the vehicle comprises a test arrangement according embodiments herein.

Since the vehicle comprises a test arrangement according embodiments herein, which vehicle test arrangement is arranged to output an approved test result if the difference between the determined battery voltage and the pre-defined reference voltage falls within a predetermined range, a capacity for the alternator in the selected pre-determined environmental condition is determined.

Thus, hereby is provided a vehicle eliminating or at least reducing the problems and/or drawbacks described above.

Further features of, and advantages with, the embodiments herein will become apparent when studying the appended claims and the following detailed description.

BRIEF DESCRIPTION OF THE DRAWINGS

The various aspects of embodiments herein, including their particular features and advantages, will be readily understood from the following detailed description and the accompanying drawings, in which.

DETAILED DESCRIPTION

As required, detailed embodiments of the present disclosure are disclosed herein. However, it is to be understood that the disclosed embodiments are merely exemplary of the disclosure that may be embodied in various and alternative forms. The figures are not necessarily to scale. Some features may be exaggerated or minimized to show details of particular components. Therefore, specific structural and functional details disclosed herein are not to be interpreted as limiting, but merely as a representative basis for teaching one skilled in the art.

Embodiments herein will now be described more fully with reference to the accompanying drawings, in which example embodiments are shown. Examples in the description wherein a particular voltage, current and/or amount of time is given are intended to be non-limiting, only used to illustrate some exemplifying embodiments. Disclosed features of example embodiments may be combined as readily understood by one of ordinary skill in the art to which this application belongs. Like numbers refer to like elements throughout.

Well-known functions or constructions will not necessarily be described in detail for brevity and/or clarity.

Figure 1:
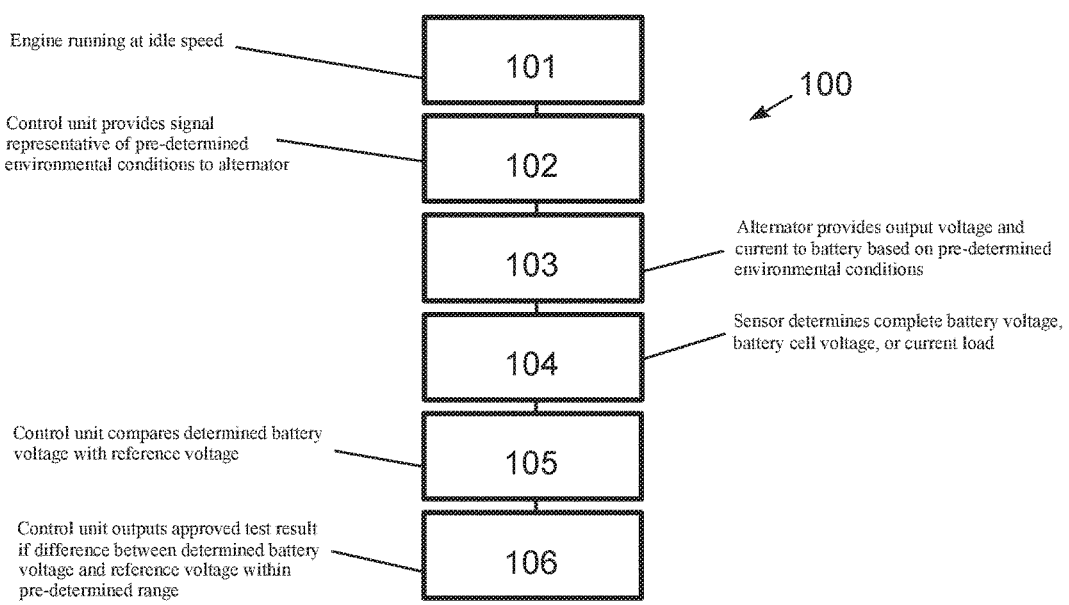
FIG. 1 illustrates a method for performing a diagnostic test of an alternator of a vehicle.

FIG. 1 illustrates a method 100 for performing a diagnostic test of an alternator of a vehicle. The vehicle comprises an internal combustion engine, which is arranged to drive the alternator. The vehicle may be e.g. a car, a recreational vehicle, a truck, a bus, an all-terrain-vehicle or a motorcycle. The method may be performed on substantially any vehicle comprising an internal combustion engine, a battery and an alternator.

An alternator in a vehicle is an electromechanical device that transfers mechanical energy from the internal combustion engine of the vehicle into electrical energy. The electrical energy may be provided in the form of an alternating current. The alternator may use a rotating magnetic field with a stationary armature, or a rotating armature with a stationary magnetic field. A charging output of the alternator, driven by an internal combustion engine at idle speed, may be used to charge a battery via an electrical connection between the alternator and the battery.

The output current of the alternator may be e.g. 50-100 A at 12 V, depending on the loads in the vehicle electrical system. This may be sufficient for some vehicles, such as cars. If the vehicle is equipped with various electrical consumers, such as air conditioning, seat heaters and electrically powered steering assistance a higher voltage/current may be necessary. Commercial vehicles, often with combustion engines running on diesel, may need 24 V.

In the method 100 illustrated in FIG. 1 the internal combustion engine is running 101 at idle speed. During idling the engine is disconnected from the vehicle drivetrain. Idle speed for internal combustion engines of cars are typically between 500-1000 rpm, but the idle speed may vary between different vehicle models. In commercial vehicles the idle speed is often between 500-600 rpm.

A control unit of the vehicle provides 102 a signal representative of a pre-determined environmental condition to the alternator. The signal representative of a pre-determined environmental condition, such as a selected temperature, may comprise e.g. charging voltage information. The control unit may comprise one or more processors with associated software and one or more memory units in communication with the one or more processors. The control unit may also comprise an application programming interface, API, which specifies how software components may interact with each other.

The control unit may be arranged to control several vehicle functions and arrangements, and may be connectable to external test arrangements, e.g. via an on-board-diagnostic (OBD)-connection.

The alternator provides 103, an output voltage and an output current to the battery based on the pre-determined environmental condition.

The battery may comprise a sensor. Alternatively the battery is connected to a sensor.

The sensor determines 104, at least one of the following; complete battery voltage, voltage of respective battery cells and current load. The sensor further provides the determined battery voltage and current load to the control unit.

The control unit compares 105 the determined battery voltage with a pre-defined reference-voltage representative of the pre-determined environmental condition. The control unit further outputs 106, an approved test result if the difference between the determined battery voltage and the pre-defined reference voltage falls within a predetermined range. For example, the control unit only outputs an approved test result for a selected pre-determined condition if the difference between the determined battery voltage and the pre-defined reference voltage is within +/−0.2 or +/−0.3 V.

Figure 2:
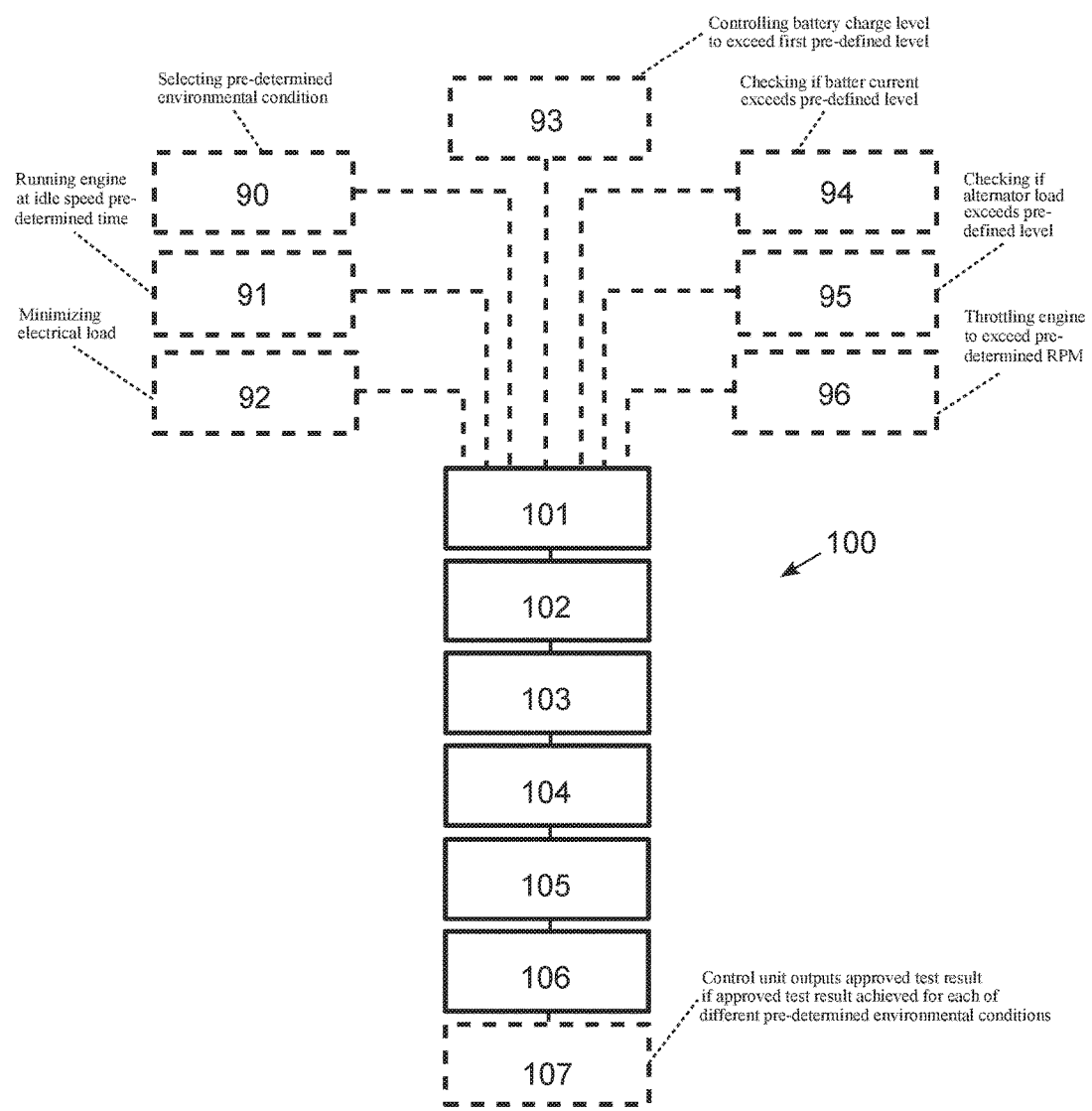
FIG. 2 illustrates a method according to some embodiments.

FIG. 2 illustrates a method 100 according to some embodiments. All or some of the method steps indicated with dashed lines may be performed.

According to some embodiments, the method 100 includes selecting 90 the pre-determined environmental condition to represent at least one of a pre-determined temperature and a pre-determined temperature-range. A physical battery temperature is then replaced by a virtual value, which is indicative of a physical battery temperature. Since the alternator may charge the battery with different voltages depending on the battery temperature, the virtual value is used to control the alternator to charge the battery with a voltage which it normally would have charged a battery with at the specific temperature.

According to some embodiments, the method 100 includes running 91 the internal combustion engine on idle speed for at least a pre-determined amount of time before providing the signal representative of a pre-determined environmental condition to the alternator. During idling electrical consumers may be minimized and the alternator may have time to return to a normal "charging mode" after the start of the internal combustion engine. The pre-determined amount of time may be e.g. 30-120 seconds.

In FIG. 2 it is illustrated that the method 100 may include minimizing 92 of electrical loads and current consumers before providing the signal representative of a pre-determined environmental condition to the alternator. Further, is may be checked that there are no bad- or intermediate contacts between components, and that electrical connections are properly connected to each other. If any alternator fault codes are detected, they may be restored and/or fixed before the method 100 is performed.

The method 100 may include controlling 93 the battery charge level to exceed a first predefined level. A higher charge level may render a more reliable test result, and according to some embodiments, the battery charge level shall exceed 50%. Otherwise the method 100 may be aborted and the battery charged before the method 100 is started again.

According to some embodiments, the method 100 includes checking 94 if the battery current exceeds a predefined value. It may be valuable to gain information on the battery current level for various troubleshooting activities, before providing 102 a signal representative of a pre-determined environmental condition to the alternator or during other steps of the method 100.

As illustrated in FIG. 2, the method 100 may include checking 95 if the alternator load exceeds a predefined value. As mentioned above, this information may be used to check whether the battery is too discharged, if the alternator is substantially fully loaded, if electrical loads are correctly adjusted and/or if the different parts of the electrical system are properly connected to each other.

According to some embodiments, the method 100 includes throttling 96 the internal combustion engine such that it exceeds a predetermined rpm for a predetermined amount of time, such that the alternator is allowed to self-magnetize.

According to some embodiments, the method 100 is repeatedly performed for a plurality of different pre-determined environmental conditions. The control unit then outputs 107, an approved total test result only if an approved test result is achieved for each of the abovementioned plurality of different pre-determined environmental conditions. Hereby the functionality of the alternator may be controlled e.g. for a plurality of different temperatures, and the alternator may be overall approved only if the alternator is approved for all the tested temperatures. If the alternator fails for one or more temperatures, the alternator may need to be further tested and/or replaced.

Figure 3:
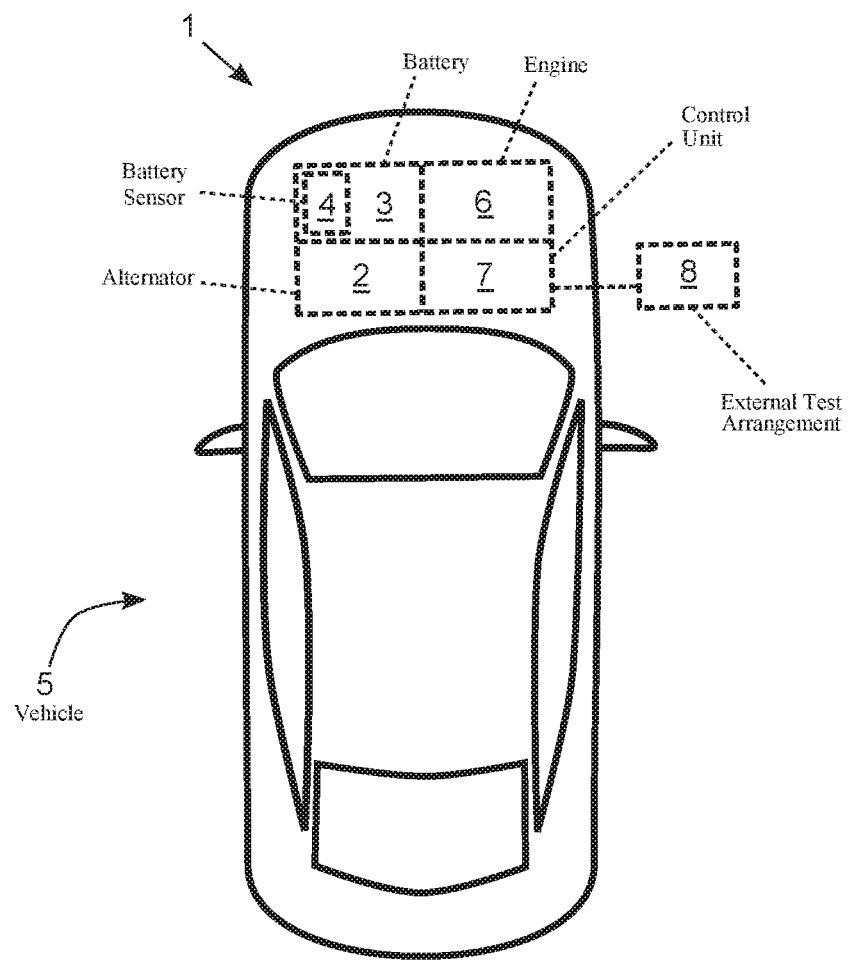
FIG. 3 illustrates a vehicle and a test arrangement.

In FIG. 3 is illustrated a test arrangement 1 for performing a diagnostic test of an alternator 2. The test arrangement 1, the alternator 2 and a battery 3 with a battery sensor 4 is comprised in a vehicle 5. The vehicle 5 further comprises an internal combustion engine 6 arranged to drive the alternator 2 and a control unit 7. The driven alternator 2 is arranged to charge the battery 3 via an electrical connection.

The battery sensor 4 may be comprised in the battery 3 or may be connected to the battery 3. The battery sensor 4 is arranged to determine at least one of battery voltage, voltage of respective battery cells and current load. The sensor 4 is further arranged to provide the determined battery voltage and current load to the control unit 7. The control unit 7 is arranged to provide a signal representative of a pre-determined environmental condition to the alternator 2.

The alternator 2 is, when driven by the idling internal combustion engine 6, arranged to provide an output voltage and output current to the battery 3 based on the pre-determined environmental condition.

The control unit 7 is arranged to compare the determined battery voltage with a pre-defined reference-voltage, representative of the pre-determined environmental condition, and to output an approved test result if the difference between the determined battery voltage and the pre-defined reference voltage falls within a predetermined range. The pre-defined reference-voltage may be an ideal voltage for a particular temperature, i.e. a voltage that the alternator normally would charge the battery with at a particular temperature, given that the alternator functions properly.

As illustrated in FIG. 3, the control unit 7 may be connected to an external test arrangement 8. The external test arrangement 8 may comprise one or more processing units and a user interface. A processing unit may be a central processing unit, CPU, also referred to as a central processor unit. A CPU is hardware within a computer that carries out instructions of a computer program/software when this is executed by performing basic arithmetical, logical, and input/output operations. The test arrangement 8 may also comprise an accelerated processing unit, APU, also referred to as an advanced processing unit. An APU is a processing unit that includes additional processing capability designed to accelerate one or more types of computations outside of a CPU. The test arrangement 8 may also comprise an application programming interface, API, which specifies how software components may interact with each other.

The test arrangement 8 may comprise one or more memory units in communication with the one or more processors. The test arrangement 8 may allow a user to input instructions to the control unit 7 via the user interface of the test arrangement 8. For example, a user may start and/or abort the method 100 via the test arrangement 8, and results from the method 100 may be communicated to the user via the test arrangement 8. The test arrangement 8 may be connected to remote servers, such that information may be transmitted between the vehicle and the remote servers. The test arrangement 8 may be arranged at a vehicle workshop, and may be connected via an OBD-connection arranged in the vehicle 5.

As used herein, the term "comprising" or "comprises" is open-ended, and includes one or more stated features, elements, steps, components or functions but does not preclude the presence or addition of one or more other features, elements, steps, components, functions or groups thereof.

As will be realized, the disclosure is capable of modification in various obvious respects, all without departing from the scope of the appended claims. Accordingly, the drawings and the description are to be regarded as illustrative in nature, and not restrictive.

While exemplary embodiments are described above, it is not intended that these embodiments describe all possible forms of the disclosure. Rather, the words used in the specification are words of description rather than limitation, and it is understood that various changes may be made without departing from the spirit and scope of the disclosure. Additionally, the features of various implementing embodiments may be combined to form further embodiments of the disclosure.

What is claimed is:

1. A method for performing a diagnostic test of an alternator of a vehicle comprising an internal combustion engine arranged to drive the alternator and the driven alternator being arranged to charge a battery via an electrical connection thereto, the method comprising:
running the internal combustion engine at idle speed;
providing, by a control unit, a plurality of test signals, each test signal representative of a different pre-determined environmental condition to the alternator;
providing, by the alternator, in response to each test signal, an output voltage and output current to the battery based on the pre-determined environmental condition;
determining, by a sensor connected to the battery, for each output voltage and output current provided by the alternator, a battery voltage comprising at least one of a complete battery voltage and a voltage of respective battery cells;
providing the determined battery voltage to the control unit;
comparing, by the control unit, each determined battery voltage with a pre-defined reference-voltage representative of one of the different pre-determined environmental conditions; and
outputting, by the control unit, an approved total test result if the difference between each determined battery voltage and pre-defined reference voltage falls within a predetermined range for each of the different pre-determined environmental conditions.

2. The method of claim 1 further comprising:
selecting the pre-determined environmental condition to represent at least one of a pre-determined temperature and a pre-determined temperature-range.

3. The method of claim 2 further comprising:
running the internal combustion engine on idle speed for a pre-determined amount of time before providing the signal representative of a pre-determined environmental condition to the alternator.

4. The method of claim 2 further comprising:
minimizing electrical loads and current consumers before providing the signal representative of a pre-determined environmental condition to the alternator.

5. The method of claim 1 further comprising:
running the internal combustion engine on idle speed for a pre-determined amount of time before providing the signal representative of a pre-determined environmental condition to the alternator.

6. The method of claim 5 further comprising:
minimizing electrical loads and current consumers before providing the signal representative of a pre-determined environmental condition to the alternator.

7. The method of claim 1 further comprising:
minimizing electrical loads and current consumers before providing the signal representative of a pre-determined environmental condition to the alternator.

8. The method of claim 1 further comprising:
controlling the battery charge level to exceed a first predefined level.

9. The method of claim 1 further comprising:
checking if the battery current exceeds a predefined value.

10. The method of claim 1 further comprising:
checking if the alternator load exceeds a predefined value.

11. The method of claim 1 further comprising:
throttling the combustion engine such that it exceeds a predetermined revolutions per minute (rpm) for a pre-determined amount of time.

12. A test arrangement for performing a diagnostic test of an alternator of a vehicle comprising an internal combustion engine arranged to drive the alternator and the alternator being arranged to charge a battery via an electrical connection thereto, and wherein the battery is connected to a battery sensor for determining at least one of a complete battery voltage and a voltage of respective battery cells, the test arrangement comprising:

a control unit configured to provide a plurality of test signals, each test signal representative of a different pre-determined environmental condition to the alternator;

wherein the alternator, when driven by the idling internal combustion engine, is configured to provide, in response to each test signal, an output voltage and output current to the battery based on the pre-determined environmental condition;

wherein the sensor is configured to determine, for each output voltage and output current provided by the alternator, a battery voltage comprising at least one of a complete battery voltage and a voltage of respective battery cell and to provide the determined battery voltage to the control unit; and wherein the control unit is arranged to compare each determined battery voltage with a pre-defined reference-voltage representative of one of the different pre-determined environmental conditions and to output an approved total test result if the difference between each determined battery voltage and pre-defined reference voltage falls within a predetermined range for each of the different pre-determined environmental conditions.

13. A vehicle comprising a test arrangement according to claim 12.

* * * * *